United States Patent [19]
Ohta

[11] Patent Number: 4,591,871
[45] Date of Patent: May 27, 1986

[54] RECORDER WITH FUNCTIONS TO CORRECT EXPANSION OR CONTRACTION OF RECORDING PAPER

[75] Inventor: Kazufumi Ohta, Tokyo, Japan

[73] Assignee: Yokogawa Hokushin Electric Corporation, Tokyo, Japan

[21] Appl. No.: 656,865

[22] Filed: Oct. 2, 1984

[30] Foreign Application Priority Data

Oct. 4, 1983 [JP] Japan .................. 58-185311
Oct. 7, 1983 [JP] Japan .................. 58-156727[U]

[51] Int. Cl.⁴ .................................. G01D 9/28
[52] U.S. Cl. ........................................ 346/49
[58] Field of Search .................. 346/34, 49, 46

[56] References Cited

U.S. PATENT DOCUMENTS 4,433,338 2/1984 Nakagawa .................. 346/34

FOREIGN PATENT DOCUMENTS 58-71413 4/1983 Japan .

Primary Examiner—E. A. Goldberg
Assistant Examiner—M. Reinhart
Attorney, Agent, or Firm—Moonray Kojima

[57] ABSTRACT

A recorder including an A/D converter for converting analog measured input signals into digital input sampling data for a predetermined sampling period, for processing the converted data by a microprocessor, and for subsequently driving a recording head to make a recording on a recording paper. A paper end detecting sensor is carried on the head, and the microprocessor is caused to compute a recording position signal according to the measured input signals on the basis of the sampling data; to correct the recording position signal on the basis of both a reference width for the recording paper and the paper width, which is measured as a result of detecting the 0% and 100% ends of the recording paper by the sensor, thereby to produce a recording position correcting signal according to the extension or contraction of the recording paper; to control the position of the recording head in accordance with the recording position correcting signal; and to make a recording on the recording paper by the recording head.

13 Claims, 9 Drawing Figures

RECORDER WITH FUNCTIONS TO CORRECT EXPANSION OR CONTRACTION OF RECORDING PAPER

BACKGROUND OF THE INVENTION

1. Field of Invention

This invention relates to a recorder for performing recording operation on a recording paper in response to measured input signals.

2. Description of Prior Art

Recorders which use microprocessors are known. One example is disclosed in U.S. Pat. No. 4,433,338. In these prior recorders which record data on a recording paper, recording precision cannot be maintained when the recording paper is changed in dimension, such as extension or contract which occur with changes in ambient humidity. Prior art recorders have not dealt with this problem and hence recording precision is not continuously maintained. U.S. Pat. No. 4,433,338 does not deal extensively with this problem nor correct adverse effects resulting from for example expansions and contractions of the recording paper.

Moreover, prior art ordinary recorders are further deficient in that although they are sufficient for steady state recording or event recording alone, because of their mutually exclusive purposes, they have heretofore never been combined in one apparatus to perform both functions.

The prior art steady state recorders are usually sufficient to perform recording operation for a long sampling period because they are used mainly for recording and monitoring occurences which are not changed very substantially in a steady state.

On the other hand, an event recorder is used when the recording changes are substantial, such as occurence of disorder in a system, to make records before and after the timing, which timing is for a short sampling period, so that the records may be used for fine operation analysis. The event recorder requires a memory for storing a considerable amount of data because the data before and after an event are to be recorded, or are outputted upon operator request.

The ordinary steady state recorder does not need a memory because it is sufficient to output the sampled data at each sampling instant. Since these two types of recorders have different intended purposes and required functions, heretofore, they have usually been positioned as different and independent, separate devices.

Generally, the input signals to be recorded in the event recorder are so important that they have to be frequently recorded and monitored, as usual, also in the steady state. Thus, heretofore, it was the practice to input an input signal commonly and in parallel to both the steady state recorder and the event recorder. That is to say, two separate recorders were both accessed in parallel. This practice, of course, was disadvantageous since the cost was at least two fold, the power requirements were two fold, and possibility of breakdown increased. Furthermore, the recording format characteristics for the steady state recorder and the event recorder are frequently different and often mutually exclusive, so as to require different recording criteria for both the steady state and event recording. Furthermore, such different recording criteria cannot be accurately and quickly determined.

It would be advantageous to perform event and steady state recording on a common recording paper through a switching technique. The prior art, including U.S. Pat. No. 4,433,338, is deficient on this point.

Moreover, it is desirable to prevent the continuity of recording of steady state data from being interrupted and the steady state data from being lost by recording of the event.

SUMMARY OF THE INVENTION

Accordingly, an object of the invention is to overcome the aforementioned and other defects, deficiencies and disadvantages of the prior art.

Another object is to provide a recorder which can automatically eliminate or counteract the adverse influence resulting from expansion or contraction of the recording paper, and thereby to maintain recording precision at all times.

A further object is to provide a recorder which can switch recording modes between steady state recording and event recording.

A still further object is to provide a recorder which can interrupt the common recording paper with the event recording while holding continuity of the steady state recording so that neither steady state data nor event data is lost.

DETAILED DESCRIPTION OF THE PREFERRED EMBODIMENTS

Figure 1:
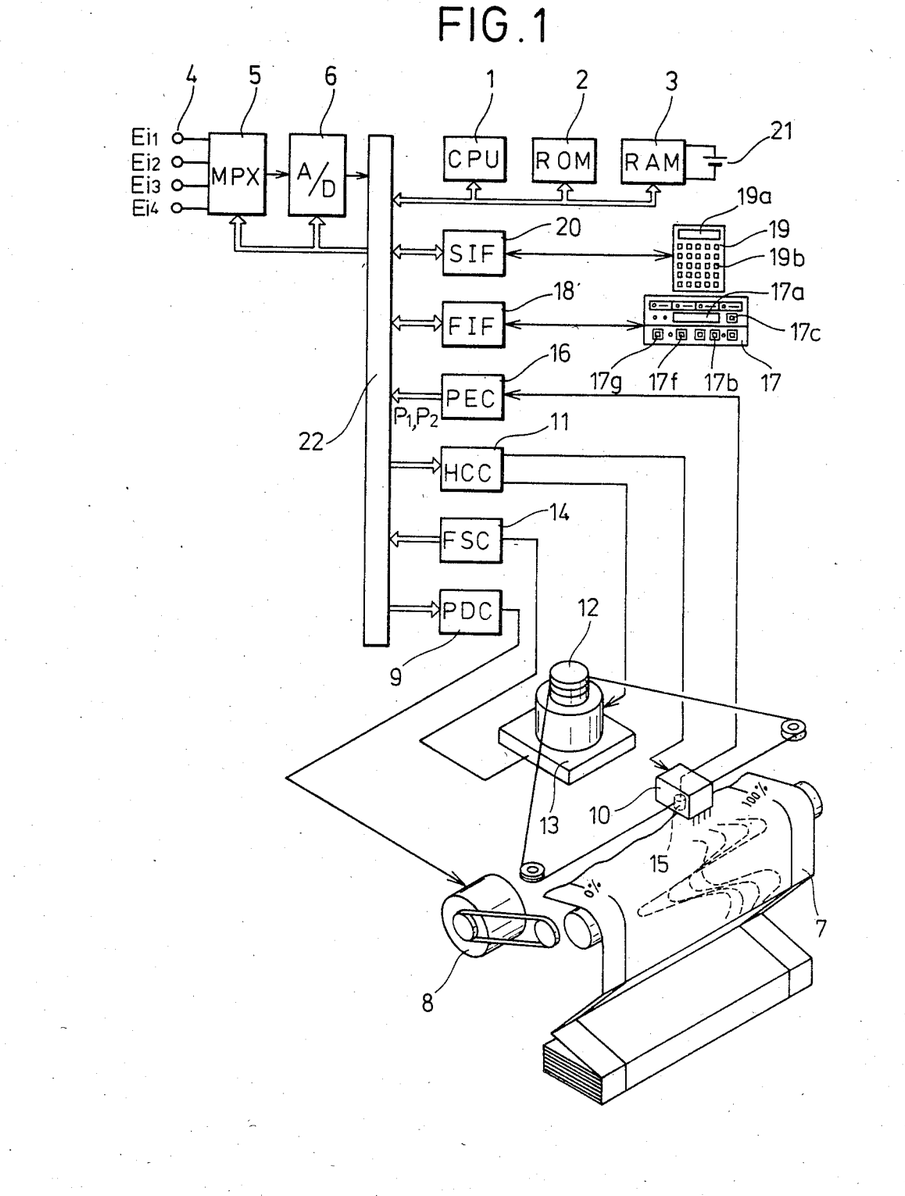
FIG. 1 is a block diagram depicting an illustrative embodiment of the invention.
Figure 2:
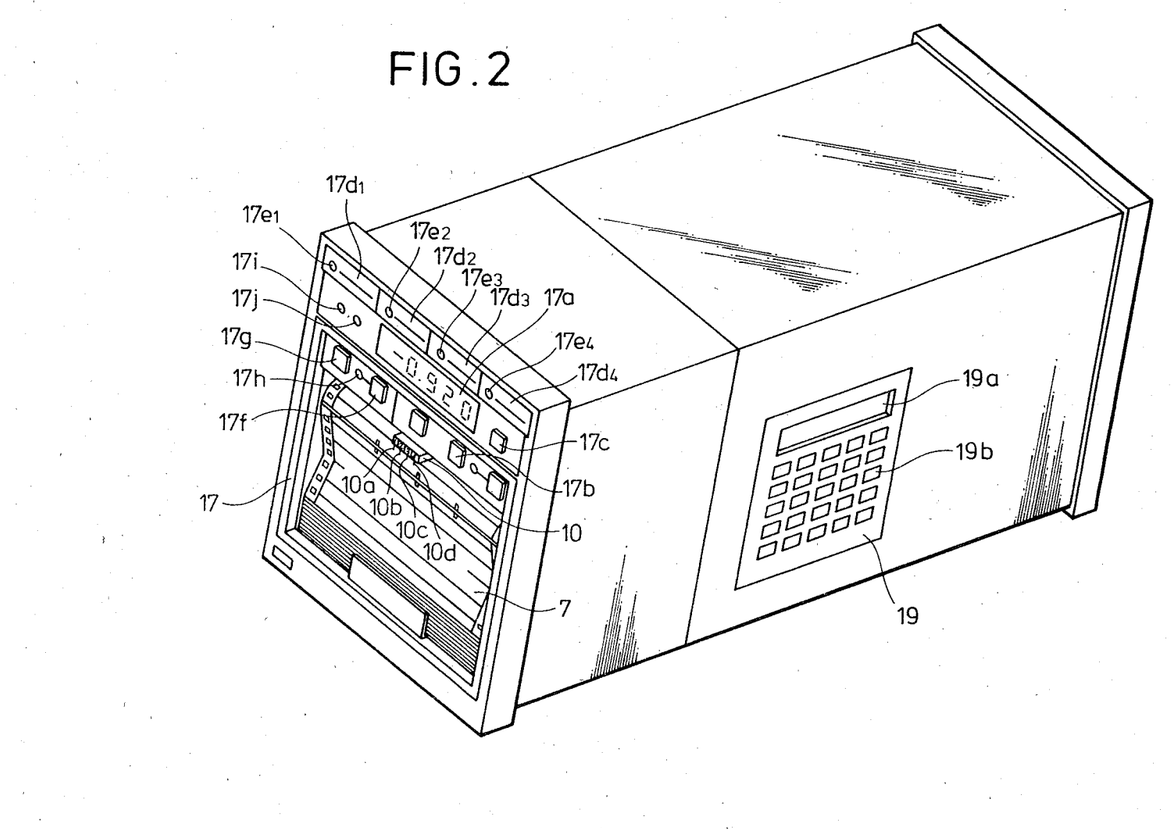
FIG. 2 is a perspective view depicting the external configuration of the embodiment.

Turning now to FIGS. 1 and 2, the illustrative embodiment comprises recording head 10, driven by recording head driving motor 12, which records data on recording paper 7 held on a roller (not numbered) driven by paper feed drive mechanism 8, comprising a motor. Located on head 10 is a reflection type photo sensor 15. Located for use with motor 12 is an encoder, as depicted. The operative circuit for driving the paper 7 and head 10 for recording, comprising input terminals 4, to which input signals Ei1 . . . Ei4 are applied. The input terminals are led to a multiplexer 5, and then to analog to digital (A/D) converter 6, then to bus 22, which also provides feedback to multiplexer 5 and converter 6, as depicted. The bus 22 is shown representationally, and may be, as desired, a common circuit or a plurality of individual connections.

The circuitry is under control of central processing unit (CPU) 1 which may be a microprocessor which is suitably programmed with logic performing functions to be described in greater detail hereinbelow. Interconnected for two way access by CPU 1 and through bus 22 are read only memory (ROM) 2 and random access memory (RAM) 3, which RAM is connected to a backup battery 21 for emergency use. The RAM 3 has a plurality of memory sections (not shown in FIG. 1, but shown in other figures) for storage of data, as described hereinbelow.

FIG. 2 shows front panel 17 having equipped thereon, data display 17a, list print instructing push button 17b, push button 17c which is used to select the channel of the displayed data, selected data display 17d1 . . . 17d4, selected data indicating lamps 17e1. . . 17e4, event record selecting push button 17g, event trigger input indicating lamp 17h, warning lamp 17i, and fail lamp 17j. These buttons 17a-17j, are connected to suitable circuitry and two way access to front panel interface (FIF) 18. Some of the items are not shown in both FIGS. 1 and 2 for simplicity of description, but are assumed to be present in both.

A tuning board 19, which may be located on one side of a container (not numbered in FIG. 2) for the recorder, has equipped thereon, a display 19a and keyboard 19b. The tuning board 19 is connected to suitable circuitry and via two way access to tuning board interface (SIF) 20.

The interfaces 18 and 20 are two way connected to bus 22 as depicted.

Photo sensor 15 on head 10 is connected for input of sensor signal to paper detecting circuity 16 (PEC) which thereupon supplies signals P1P2 to bus 22 for transmittal.

Signals for activating recording head 10 (and its components) are supplied through bus 22 to recording head control circuit 11 (HCC) which circuit 11 also provides signals to motor 12 for moving the head 10.

Encoder 13 provides signals as to position to position feedback signal generating circuit (FSC) 14, which supplies signals to bus 22 for transmittal.

Signal for driving the paper feed motor 8 is supplied through bus 22 to paper feed drive circuit (PDC) 9.

As shown in FIG. 2, the head 10 may comprise a plurality of individual print elements, such as pens 10a . . . 10d, which elements may be of different colored inks. The CPU 1 controls, partly or otherwise, the respective units in the circuit, in accordance with the program stored in ROM 2 and processes, partly or otherwise, data stored in RAM 3, so that a predetermined recording may be made on the paper 7 by action of recording head 10.

Analog measured input signals Ei1, Ei2, Ei3 and Ei4, which are applied to input terminals 4, are selected each for period of, for example, 0.2 seconds, by multiplexer 5, under control of CPU 1, and are inputted to A/D converter 6, which converter 6 then converts same into digital signals. The digital signals are then stored consecutively as sampling data SD in RAM 3.

A sampling period $T_S$ for converting the analog signals into digital signals may be set shorter than recording period $T_R$ for driving recording head 10, to effect recording operation. Recording period $T_R$ may be automatically selected, for example, with a range of from 1.5 seconds to 90 seconds, in accordance with the running speed of recording paper 7. For example, recording period $T_R$ may be 45 seconds, in case the speed of paper 7 is 20 mm/h. As a result, for recording period $T_R$, a plurality of samplings are conducted in response to each analog signal applied to each input terminal 4 so that RAM 3 is stored with plural sampling data SD (see FIGS. 3 and 6) in response to each analog signal.

CPU 1 computes the raw values (i.e., the sampling data immediately before the recording period $T_R$), the maximum value, the minimum value and the mean value for each recording period $T_R$ and causes the computed data in registers R1, R2, R3 and R4 especially for RAM 3, respectively. On the other hand, sampling data SD are consecutively stored in an event data memory MA1 (see FIG. 6) of RAM 3 for an event data storing period $T_1$ (e.g. 0.2 to 10 seconds) set by the tuning board 19. The event data memory MA1 has sufficient capacity to store, for example, 512 data, in response to each input. When the storage capacity is filled up with old data, the memory MA1 consecutively disperses the old data, each time it receives a new data, to renew data.

Recording paper 7 is fed a predetermined distance in a predetermined direction by paper feed mechanism 9 under control of CPU 1 each time recording head 10 is scanned.

The scanning of this head 10 is conducted in a direction perpendicular to the feeding direction of paper 7 by motor 12 under control of CPU 1 while recording paper 7 is paused. Head 10 is arranged in the moving direction of head 10 with, for example, a plurality of pens having different ink colors, e.g. pen 10 may be red, pen 10b may be green, pen 10c may be purple, and pen 10d may be black, so that one of the pens in a predetermined color is selectively driven to make a record on recording paper 7 in accordance with the control signal from recording head control circuit 11. The position of head 10 is detected by encoder 13 and the recording head position detecting circuit 14 and is stored as a position feedback signal F of, for example, from 0 to 5,000, in RAM 3. This position feedback signal F thus stored in RAM 3 is reset by a 0% side paper end detecting signal P1 (see FIG. 3) from paper end detecting circuit 16.

Reflection type photo sensor 15 detects in terms of presence or absence of a reflected ray whether or not recording head 10 is positioned above paper 7, and outputs a sensor signal which is turned ON or OFF according to the presence or absense of the reflected ray. In this case, paper 7, which is white, is made to run above a black portion so as to clearly define the presence or absence of a reflected ray. Paper end detecting circuit 16 detects the rise from OFF to ON and the break from ON to OFF of the sensor signal coming from photo sensor 15 thereby to output paper end detecting signal P1 indicating the 0% end of paper 7 and paper end detecting signal P2 indicating the 100% end of paper 7 (see FIG. 3).

STEADY STATE RECORDING

Figure 3:
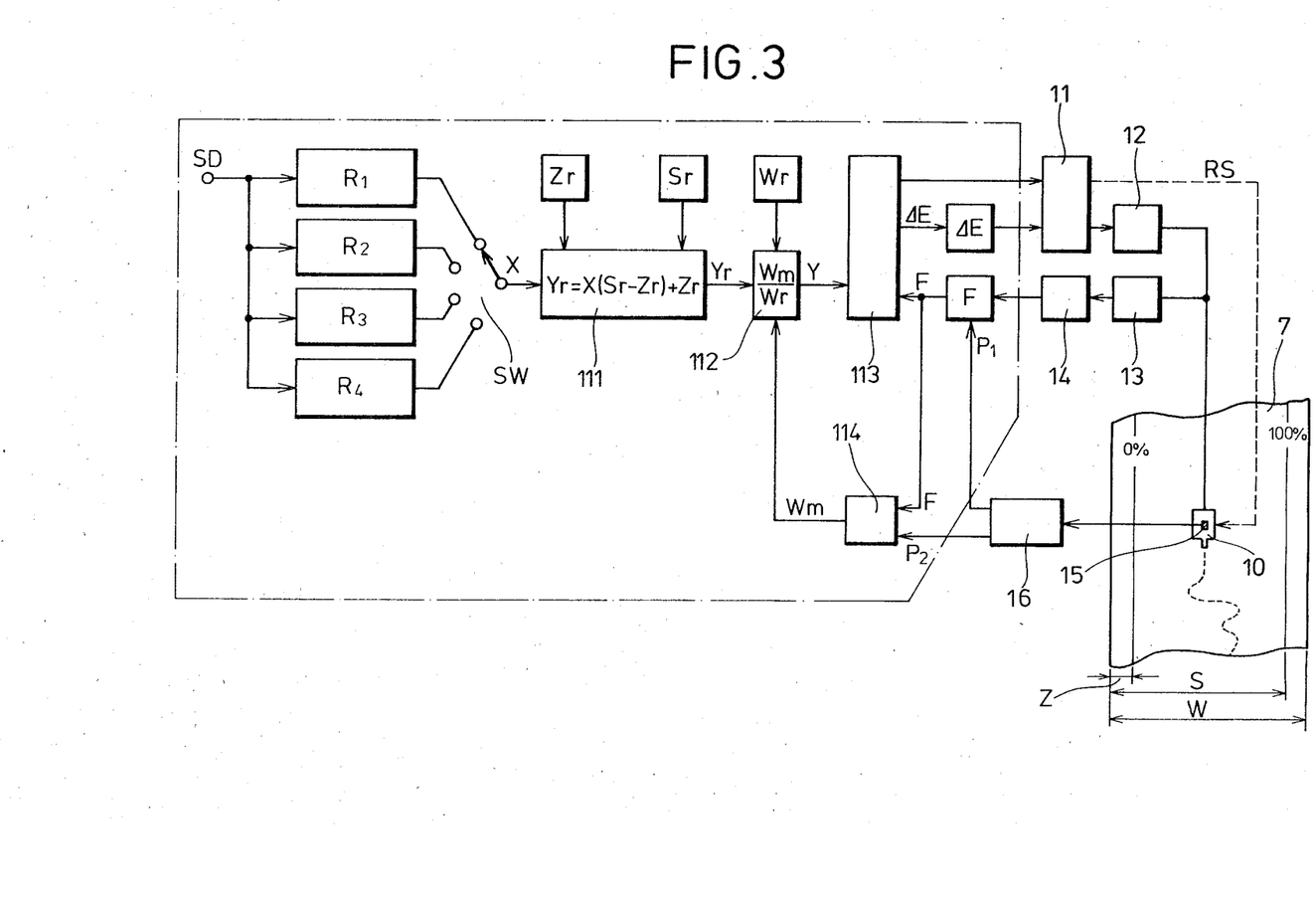
FIG. 3 is a block diagram depicting the functions of the embodiment.

The steady state recording operation of the illustrative embodiment will now be described with reference to FIGS. 3, 4 and 5. In FIG. 3, a recording position arithmetic unit 111, a correcting arithmetic unit 112, a recording position determining arithmetic unit 113 and a paper width detecting unit 114 are constructed in accordance with a program of CPU 1.

To recording position arithmetic unit 111, there is applied data X which is selected by a change over switch SW from the computed data stored in registers R1,R2,R3 and R4 in accordance with the recording mode set by tuning board 19.

The recording position arithmetic unit 111 executes computation of the following equation (1) for the measured input X on the basis of both the distance Zr from the 0% paper end (i.e. a reference position) of paper 7, which was determined in advance during adjustment, to the 0% point of the recording position and the distance Sr from that reference position to the 100% point of the recording position thereby to determine a recording position signal Yr during the adjustment. The distances Zr and Sr are set by converting them into position feedback signal F (e.g. 0 to 5,000) indicating the position of recording head 10.

$$Yr = X(Sr - Zr) + Zr \quad (1)$$

Correcting arithmetic unit 112 determines the extending or contracting ratio of Wm/Wr of recording paper 7 on the basis of both that distance from the 0% end of recording paper 7 to the 100% end, which was determined in advance during the adjustment (ie the reference paper width Wr and paper width Wm measured during the operation) and executes correcting computation of the following equation (2) for recording position signal Yr thereby to determine the recording position correcting signal Y which was corrected in accordance with the extension or contraction of paper 7. Paper widths Wr and Wm are values converted into those of the position feedback signal F.

$$Y = Yr \cdot Wm/Wr \quad (2)$$

The recording position determining arithmetic unit 113 drives pulse motor 12 through recording head control circuit 11 in accordance with the difference signal ΔE between the recording position correcting signal Y and the position feedback signal F indicating the position of recording head 10 thereby to move recording head 10 in the widthwise direction of paper 7 until the recording position correcting signal Y and the position feedback signal F are balanced, and imparts a recording instruction to head 10 at the balanced point thereby to dot record that position on paper 7.

Paper width detecting unit 114 reads in the value of position feedback signal F at the instant the 100% paper end signal P2 is applied from paper end detecting circuit 16 thereby to determine paper width Wm.

In the foregoing described embodiment, at the initial state, recording head 10 is located at the 0% end of paper 7 (i.e. the reference position) so that the position feedback signal F is reset. Head 10 is moved from that reference position toward the 100% end of paper 7 to the point at which the recording position correcting signal Y and the position feedback signal F are balanced, thereby to make the dot recording on paper 7 at that balance point. When the dot recording at the balance point is ended, recording head control circuit 11 further moves head 10 to the 100% end. As a result, when head 10 reaches the 100% end, the photosensor 15 has its output inverted so that paper end detecting circuit 16 outputs the 100% paper end detecting signal P2.

When this signal P2 is generated, the value of the position feedback signal F at that instant is read in paper width detecting unit 114, and the movement of head 10 is interrupted. After that, paper 7 is fed out a predetermined length. The value of position feedback signal F read in paper width detecting unit 114 corresponds to the distance from the 0% end to the 100% end of paper 7 (i.e. the paper width Wm.).

Next, recording position determining arithmetic unit 113 drives again the difference between the recording position correcting signal Y and the position feedback signal F to move head 10 to the 0% end of paper 7 thereby to balance the two signals Y and F. The head 10 is further moved to the 0% end after it makes the dot recording at the balance point. As a result, when head 10 reaches the 0% end of paper 7 so that the sensor signal from photo sensor 15 is inverted, paper end detecting circuit 16 outputs the 0% paper end detecting signal P1. When this signal P1 is generated, position feedback signal F is present, and head 10 is paused and returned to the reference position. When this reference position is restored, paper 7 is fed again the predetermined length. Thus, during operation, head 10 makes dot recordings two times and paper width Wm is measured one time during the period after it started the reference position and before it restores the reference position.

On the basis of paper width Wm measured during the operation, the correcting arithmetic unit 112 determines the extending or contracting ratio Wm/Wr of paper 7 to conduct the correcting computation of above equation (2). As a result, the recording position is automatically corrected in accordance with the extension or contraction of the paper 7 so that it is not adversely affected by the extension or contraction of paper 7.

Thus, the 0% end of paper 7 is used as the reference position by detecting the 0% paper end to reset the position feedback signal F. Accordingly, paper 7 may be set roughly with respect to the system and can be prevented from becoming disaligned so that its setting or feeding mechanism can be simplified, thereby to reduce production cost.

Since both the 0% and 100% end of paper 7 are detected, it is unnecessary to use a specially scaled paper. Advantageously, the recording paper used herein would not be adversely affected by printing density or blotting of the scales so that reliability is greatly enhanced.

During the adjustment, for example, the distance from the 0% end of paper 7 to the 0% point of the recording position and the distance Sr to the 100% point may be respectively convered into value of 0 to 5,000 of the position feedback signal F and are imparted to recording position arithmetic unit 111, and the ratio of Wm/Wr of correcting arithmetic unit 112 may be set at 1. After that, measured input X is switched to 0% and 100% and is recorded in dots on paper 7, and distances Zr and Sr are adjusted by manually adjusting tuning board 19 so that the recording position is accurately located at the 0% and 100% points of paper 7. Next, head 10 is moved from the 0% end to the 100% end of paper 7 to conduct such an operation that the value of position feedback siganl F at the instant the paper end detecting circuit 16 detects the 100% paper end is given as the reference paper width Wr, during the adjustment, to correcting arithmetic unit 112.

In the above embodiment, one photo sensor 15 is carried on head 10. However, similar effects can be obtained using two or more such sensors to detect the 0% and 100% ends. Also, in the above embodiment, one measured input X is described. When a plurality of measured inputs X1 ... Xn, is used, recording position correcting signals Y1 to Yn are determined for the respective inputs so that the dot recording may be conducted in the order from the smallest to largest signals Y1 to Yn, when the head 10 is moved from the reference position to the 100% end, and in the order from the largest to smallest when the head 10 is returned from the 100% end to the reference position.

When head 10 is arranged in the direction of the paper width with the four recording pens 10a, 10b, 10c and 10d, as shown in FIG. 2, distances Zr and Sr are respectively adjusted for the respective recording pens so that the recording positions by the respective recording pens during the adjustment may accurately fall at the 0% and 100% ends of paper 7.

Although the measurement of the paper width in the operation is conducted once for the two recording operations, the measuring interval can be suitably determined as desired.

Figure 4:
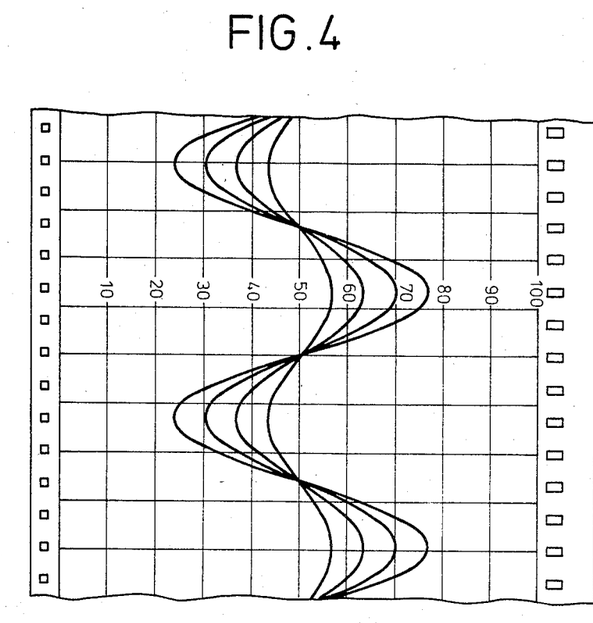
FIG. 4 depicts an exemplary dot recording on a recording sheet made by the embodiment.
Figure 5:
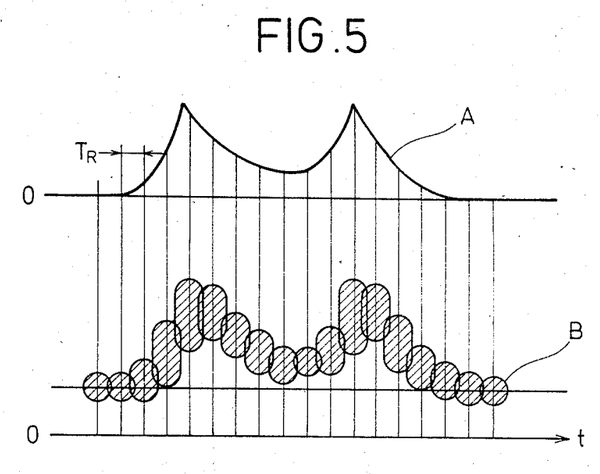
FIG. 5 is a waveform chart depicting recording operation with segments between the maximum and minimum values of the embodiment.

FIGS. 4 and 5 depict the waveforms during the steady state recording operation. The waveforms of FIG. 4 are those which are prepared by recording the raw values of the sampling data on paper 7 with the measured inputs being dots of different colors for the respective channels. Specifically, the recording head 10 has its pen 10a record input Ei1 of first channel in red dots. Pen 10b records input Ei2 of second channel in green dots. Pen 10c records input Ei3 of a third channel in purple dots. Pen 10d records input Ei4 of a fourth channel in black dots. Data display 17a displays the data of the measured input of the channel which is selected by channel selecting push button switch 17c. The channel for the display data is indicated by lighting the corresponding one of the lamps 17e1 . . . 17e4.

The maximum, minimum and mean values of the sampling data may be recorded in dots of different colors for the respective channels FIG. 5 depicts the maximum and minimum values of the sampling data in recording period $T_R$, which are recorded in continuous segments. Curve (A) depicts the waveform of the measured input. Curve (B) depicts the waveform which is recorded. If the maximum and minimum values are thus recorded in continuous segments, the signal changes for the recording period can be recorded with high fidelity so that the recording results similar to the continuous recorded ones, such as records written by pens, can be obtained. In this case, the records are also made in different colors for the respective channels.

EVENT RECORDING

Figure 6:
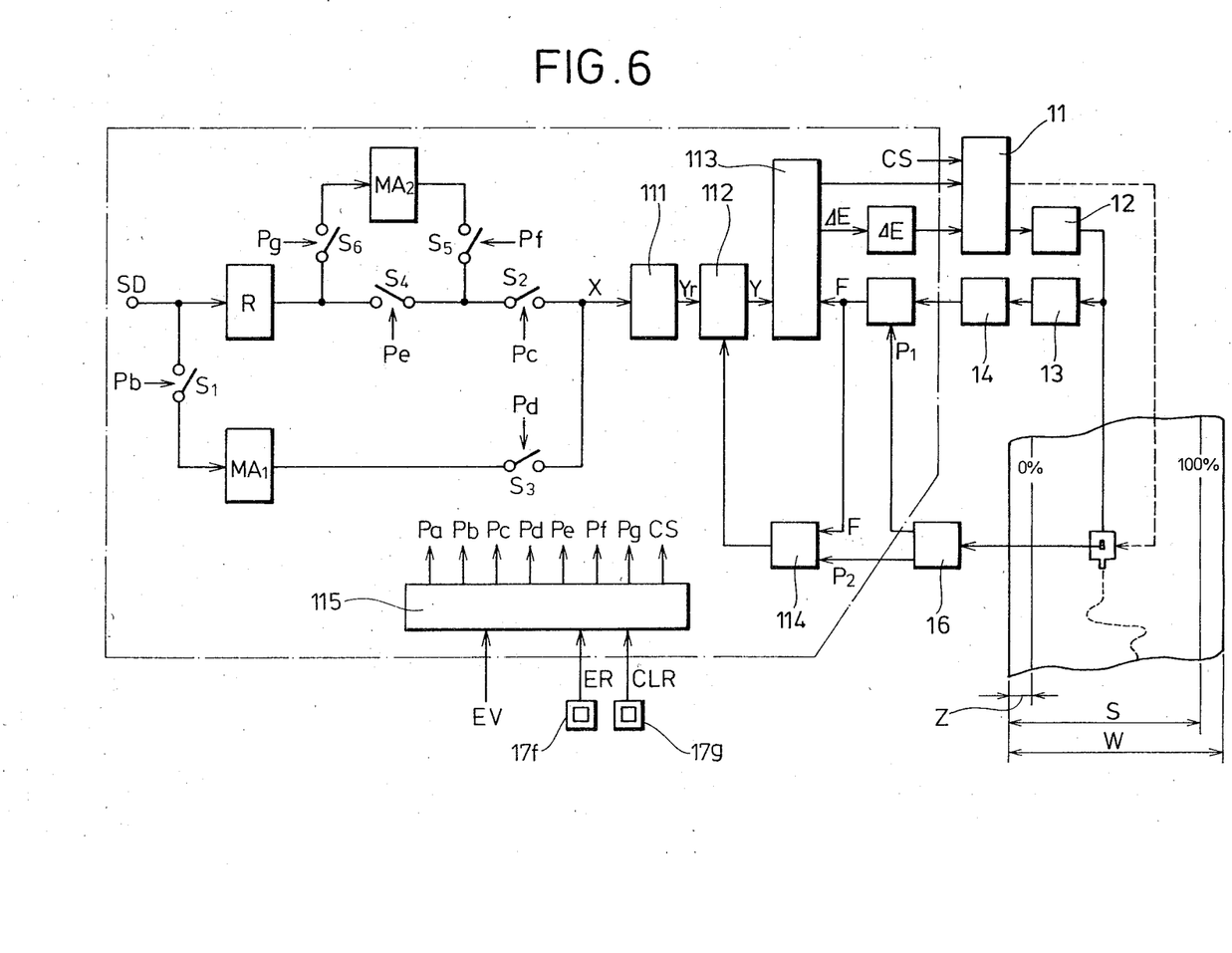
FIG. 6 is a block diagram depicting the functions of the embodiment in an event recording mode.
Figure 7:
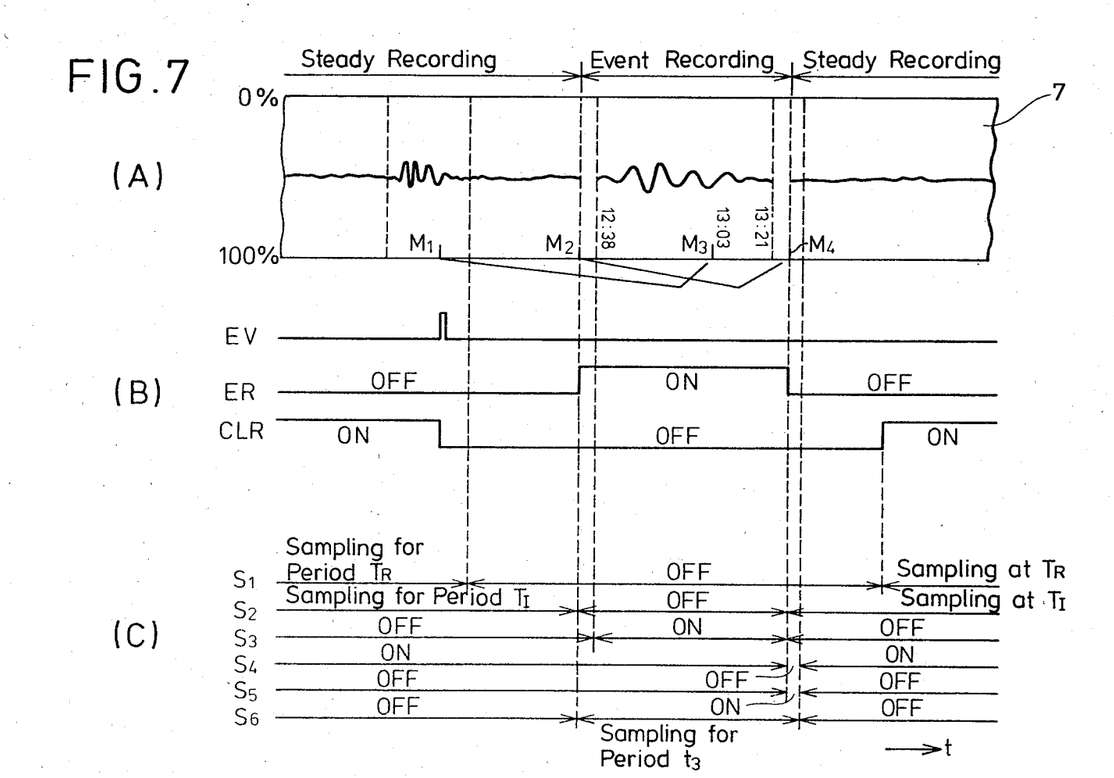
FIG. 7 depicts time charts explaining the event recording operation of the embodiment.

Event recording will now be described with reference to FIGS. 6 and 7. In FIG. 6, event data memory MA1 sequentially stores sampling data SD by means of a switch S1 which is driven by an event data recording period $T_I$ (e.g. 0.2 to 10 seconds) set in tuning board 19. Register R stores computed data of sampling data SD. Register R is shown to represent registers R1,R2,R3 and R4, for storing the raw, maximum, minimum and mean values of sampling data SD. A computed data storing memory MA2 sequentially stores the computed data of register R during the event recording operation through a switch S6 driven by recording period $T_R$. The computed data of register R are applied to the input of recording position arithmetic unit 111 through switch S4 and S2. The data of memory MA1 are applied to the input of recording position arithmetic unit 111 through a switch S3. The data of memory MA2 are applied to the input of recording position arithmetic unit 111 through switches S5 and S2. Timing control circuit 115, an ON-OFF signal ER from event recording selecting push button switch 17f, and an ON-OFF signal CLR from event data clearing push button switch 17g, thereby to generate both a pulse Pa for determining sampling period $T_S$ on basis of those signals and under a predetermined condition and pulses Pb to Pg for driving switches S1 to S6 and to output a predetermined instruction CS to recording head control circuit 11.

The event recording operation of the recorder will now be described also with reference to FIG. 7. Line (A) depicts the waveforms recorded on the recording paper. Line (B) depicts the event generating signal EV and the signals ER and CLR generated by the operations of switches 17f and 17g. Line (C) depicts the operating states of switches S1 to S6.

During steady state recording operation, switch S2 is driven for a predetermined recording period $T_R$ (e.g. 45 seconds), and switches S3,S5 and S6 are OFF and switch S4 is ON. As a result, the arithmetic data of register R are extracted for predetermined time period $T_R$ and are outputted for recording on paper 7. If an event occurs in that state, it is applied as event generating signal EV to timing control circuit 115 by an external contact or an internal range over warning. Timing control circuit 115 feeds an instruction, when it receives signal EV, to recording head control circuit 11 to put a mark $M_1$, for example, in a red color at the event point on paper 7 by means of pen 10a of head 10.

When memory MA1 completes collection of a predetermined number of data after the event, timing control circuit 115 turns OFF switch S1 to interrupt storage of the event data in memory MA1 thereby to freeze the event data. On the other hand, the steady record is continuously conducted for the predetermined recording period $T_R$.

When the operator pushes event record determining key switch 17f (ER), CPU 1 turns OFF switch S2 to interrupt the steady state recording and to send an instruction to the recording head control circuit 11, thereby to put a steady state recording interruption mark $M_2$, for example, in green color, on paper 7 by means of pen 10b of head 10, and speeds up paper 7 to shift the operation to event recording.

With a slight delay from the interruption of steady state recording, CPU 1 turns ON switch S3 to record the event data, which are stored in memory MA1, on paper 7 by means of head 10, thereby to conduct event recording. Even in the event recording, the event instant is recorded as a mark $M_3$, in for example red color on paper 7 in a manner corresponding to steady state recording. During the event recording, on the other hand, switch S6 is driven for a predetermined steady state recording period $T_R$ so that the arithmetic data of register R are sequentially stored in memory MA2 for the steady state recording period $T_R$.

The event recording on paper 7 is continued until the event data stored in memory MA1 are completely outputted. At the beginning and ending instants of the event recording on paper 7 and at the instant of the event occurrence, the instant (e.g. 12:38, 13:03, or 13:21) is printed, for example, in a red color by means of pen 10a of head 10. With a slight delay after the end of the event recording on paper 7, CPU 1 drives switch S2 for steady state recording period $T_R$ and turns OFF switches S3 and S4 and turns ON switch S5 to restore the steady state recording operation and to feed an instruction to recording head control circuit 11 thereby to indicate the restoration of the steady state record as a mark $M_4$, for example, in a green color on paper 7 and to speed down paper 7. Recording paper 7 is formed with non-recorded portions before and after the event recording. This is because it is intended to facilitate discrimination between the steady state recording and the event recording.

When the steady state recording is restored, the arithmetic data during the event recording, which are stored in memory MA2, are first recorded automatically on paper 7. When the stored data are completely outputted, switch S4 is turned ON and switches S5 and S6 are turned OFF, so that the operation is automatically shifted to that of conducting the steady state recording on paper 7. As a result, continuity of steady state recording can be held. Moreover, this continuity of steady state recording is indicated by marks $M_2$ and $M_4$ put at the instants of interruption and restoration. When key switch 17g (CLR) is then pushed, the frozen state of the event data is released to restart standby of the recording for another event.

In the above embodiment, an event record selecting push switch 17f is provided to manually switch the recording operation to the event recording. This switching to the event recording may be automatically effected when the event data are collected from first to the last after occurrence of an event. Also, in the embodiment, the frozen state of the event data is released by key operation. However, the frozen state may also be automatically released after the end of the event recording. In this case, the event recordings can be automatically repeated in an unattended state by the combination with the automatic switching function to the event recording. Moreover, the above embodiment, an analog input is described. In case a plurality of analog inputs are used, similar operations can be obtained using a plurality of event data memories and a plurality of sampling data storing memories.

As described, the embodiment comprises a memory for storing the sampling data for the steady state record during the event recording and the memory is automatically swept out after completion of the event recording. As a result, advantageously, the event recording can be introduced into the same recording paper without interrupting the continuity of the steady state recording thereby to easily compare the recordings at the instants of the steady state recording and the event occurence, and the capacity of the data storing memory can be small because the event recording is conducted continuously and at high speed while allowing a long steady state recording period.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. In a recorder of the type wherein an analog-to-digital converter converts analog measured input signals into digital sampling data for a predetermined sampling period, a microprocessor processes said signals and a recording head scans to record on a recording paper for a predetermined recording period, said recording paper having a 0% end and a 100% end of a width dimension, being perpendicular to the direction of travel of said recording paper, the improvement comprising:
   a circuit for generating recording head position signals in relation to the position of said recording head;
   a paper end detecting sensor provided on said recording head; means for resetting said circuit for generating when said sensor detects said 0% end of said recording paper; and
   a paper width sensor means for reading, as a paper width signal, recording head position signals from said circuit for generating when said sensor detects said 100% end of said recording paper;
   wherein computation of a recording position signal corresponding to the amplitude of each measured input signal is performed in accordance with said sampling data taken in said microprocessor, corrective calculation of said recording position signal is performed in accordance with both a reference width of said recording paper and width of said recording paper detected by said paper width sensor means, thereby to produce a recording position correcting signal for each measured input signal according to expansion or contraction of said recording paper, and to sequentially record on said recording paper by said recording head points where said recording position correcting signal and said recording head position signal are in equilibrium.

2. The recorder of claim 1, wherein the sampling period of said analog measured input signal is shorter than the recording period, a plurality of samplings are performed for each identical measured input for a recording period, and raw values, maximum values, minimum values and mean values of sampling data for the recording period are computed thereby to allow calculation of a recording position signal at the time of steady recording by selecting at least one of these calculation data.

3. The recorder of claim 2, wherein said recording head records said raw values of said sampling data in dot form.

4. The recorder of claim 2, wherein said recording head records said maximum values of said sampling data in dot form.

5. The recorder of claim 2, wherein said recording head records said minimum values of said sampling data in dot form.

6. The recorder of claim 2, wherein said recording head records said mean values of said sampling data in dot form.

7. The recorder of claim 2, wherein said recording head records said maximum values and minimum values of said sampling data in continuous segments.

8. The recorder of claim 2, wherein said recording head marks instant of occurrence of an event on said recording paper at each instant of said steady state record and said event record.

9. The recorder of claim 2, wherein said recording head marks on said recording paper both instants whereat said steady state recording is interrupted following switching from steady state recording to said event recording, and instant whereat said steady state recording is restored from said event recording.

10. A recorder comprising
   first means including an analog to digital converter for converting analog measured input signals into digital sampling data for a predetermined sampling period;
   a paper feed mechanism for feeding recording paper, said recording paper having a 0% end and a 100% end of a width dimension, said width dimension being perpendicular to the direction of travel of said recording paper;
   a recording head for making a recording on said recording paper for a predetermined recording period;
   means for driving said recording head;
   a position feedback signal generating circuit including an encoder connected to said recording head for detecting position of said recording head;

a paper end detecting sensor carried on said recording head for detecting said 0% end and said 100% end;
a microprocessor;
a read only memory circuit; and
a random access memory circuit;
wherein said microprocessor is connected for access and control to said first means, said feedback signal generating circuit, said paper end detecting sensor, said read only memory circuit, and said random access memory circuit, and comprising logic for
computing a recording position signal according to said measured input signals on basis of said sampling data as supplied from said first means,
correcting said recording position signal on basis of both a reference width of said recording paper as accessed from said read only memory circuit and measured width of said paper measured as a result of detecting said 0% and said 100% ends of said paper by said sensor and accessed from said random access memory circuit, thereby to produce a recording position correcting signal,
controlling said means for driving in accordance with said feedback signal and said recording position correcting signal to position
said recording head in a position whereat said recording position correcting signal and said position feedback signal are balanced, whereby correction is made for any expansion or contraction of said recording paper.

11. The recorder of claim 10, wherein said recording head has a plurality of pens of inks of different colors, said pens being arranged in a running direction of said head, whereby said recorder head may record plural recording position correcting signals corresponding to said measured input signals in different colors on said recording paper.

12. The recorder of claim 1, wherein the sampling period of said analog measured input signal is shorter than the recording period, a plurality of samplings are performed for each identical measured input for a recording period, and a register and an event data memory are provided so as to enable said register to store computation data for a steady state recording obtained by computing sampling data during the recording period and to enable said event data memory sequentially to store sampling data for an event data memory period, so that said recording position signal can be computed by selecting either of the computation data stored in said register or the event data stored in said event data memory and that said steady state recording according to the computation data stored in said register and said event recording based on said event data stored in said event data memory can be made on the recording paper by switching between said event recording and said steady state recording.

13. The recorder of claim 2, wherein a computation data storing memory may be automatically outputted for recording operation after the termination of said event recording, thereby to maintain continuity of said steady state recording, said computation data storing memory being for storing the computation data stored in said register during the event recording.

* * * * *